United States Patent
Lee et al.

(10) Patent No.: US 6,944,026 B2
(45) Date of Patent: Sep. 13, 2005

(54) HEAT SINK MOUNTING ASSEMBLY

(75) Inventors: Hsieh Kun Lee, Tu-Chen (TW);
WanLin Xia, Shenzhen (CN); Tao Li,
Shenzhen (CN)

(73) Assignee: Hon Hai Precision Ind. Co., Ltd.,
Taipei Hsien (TW)

( * ) Notice: Subject to any disclaimer, the term of this patent is extended or adjusted under 35 U.S.C. 154(b) by 13 days.

(21) Appl. No.: 10/789,664

(22) Filed: Feb. 27, 2004

(65) Prior Publication Data

US 2004/0170001 A1 Sep. 2, 2004

(30) Foreign Application Priority Data

Feb. 27, 2003 (TW) ...................................... 92203121 U

(51) Int. Cl.⁷ ............................................... H05K 7/20
(52) U.S. Cl. ........................ 361/719; 361/704; 257/718;
257/719; 257/727; 165/80.3; 165/185
(58) Field of Search ................................. 361/704, 707,
361/717–719; 174/16.3; 165/80.3, 185;
257/718, 719, 727; 248/505, 510; 24/295,
625, 455–458

(56) References Cited

U.S. PATENT DOCUMENTS

| 5,464,054 | A | | 11/1995 | Hinshaw et al. |
| 5,870,288 | A | * | 2/1999 | Chen ........................... 361/704 |
| 6,404,635 | B1 | * | 6/2002 | Wei ............................. 361/704 |
| 6,480,384 | B2 | * | 11/2002 | Lo .............................. 361/704 |
| 6,483,703 | B2 | * | 11/2002 | Hsu ............................ 361/704 |
| 6,507,491 | B1 | * | 1/2003 | Chen ........................... 361/697 |
| 2002/0036891 | A1 | * | 3/2002 | Lo .............................. 361/704 |

* cited by examiner

Primary Examiner—Boris Chervinsky
(74) Attorney, Agent, or Firm—Wei Te Chung

(57) ABSTRACT

A heat sink mounting assembly includes a retention module (80) accommodating a heat sink (50) therein, and two retaining units (10) cooperating with the retention module to secure the heat sink therein. Each retaining unit includes a retaining clip (20) engaging with the retention module, and a pressing body (40) attached to the retaining clip. The pressing body includes a pressing portion (42) urging against the heat sink, and two releasing arms (46) each having a spring finger (48) snappingly engaging with the retaining clip when the pressing body is pressed toward the heat sink. When the releasing arms are squeezed, the spring fingers disengage from the retaining clip, and the pressing portion is released from the heat sink.

17 Claims, 4 Drawing Sheets

HEAT SINK MOUNTING ASSEMBLY

BACKGROUND OF THE INVENTION

1. Field of the Invention

The present invention relates generally to mounting apparatuses, and more particularly to a mounting assembly for readily mounting a heat sink onto a heat-generating component such as a Central Processing Unit (CPU).

2. Prior Art

With the continuing development of computer electronics technology, new electronic packages such as the latest CPUs can perform more and more functions. Heat generated by these modern electronic packages has increased commensurately. Therefore, bigger and heavier heat sinks are becoming increasingly necessary to efficiently remove the heat from the electronic packages.

A conventional heat sink assembly is disclosed in U.S. Pat. No. 5,464,054. In this kind of heat sink assembly, a clip made from a single metal wire is positioned in a groove of a heat sink for mounting the heat sink to an electronic package. Two resilient arms extend from opposite ends of the clip in directions substantially perpendicular to each other. A distal end of each arm is bent to form a hook engaging in a corresponding receiver formed on a frame or socket that holds the electronic package, thereby fastening the heat sink to the electronic package. However, selecting a wire clip with an appropriate diameter can be problematic. If the wire is too thin, the clip cannot provide a sufficient spring force to hold the heat sink, and the heat sink is prone to be displaced when the assembly is subjected to vibration or shock. If the wire is too thick, an unduly large force is required to engage the clip into the corresponding receivers. Additionally, a tool is generally required for installation or removal of the clip, which makes these processes excessively time consuming. Furthermore, the tool is liable to slip during use, which can cause damage to other components adjacent the electronic package. All these difficulties reduce the efficiency of assembly in mass production facilities. Reduced efficiency is translated into increased costs.

Another kind of conventional heat sink assembly is shown in FIG. 4. The heat sink assembly comprises a socket 500, an electronic package 400 located on the socket 50, and a heat sink 300 fastened onto the electronic package 400 by a clip made from metal strips. The clip comprises a pressing body 100, and an operation body 200 cooperating with the pressing body 100. The pressing body 100 comprises a main pressing portion 120, and an arm 140 extending generally perpendicularly from an end of the pressing portion 120. A locking opening 160 is defined in the arm 140. The operation body 200 defines a connecting hole 220 movably receiving an opposite end of the pressing portion 120, so that the operation body 200 is movably attached to the opposite end of the pressing portion 120. A locking slot 240 is defined in the operation body 200, below the connecting hole 220. The socket 500 forms two ears 520 at opposite sidewalls thereof, corresponding to the locking opening 160 and the locking slot 240 respectively. In assembly, one ear 520 of the socket 500 is received in the locking opening 160 of the arm 140. The pressing portion 120 is arranged on a base 320 of the heat sink 300 between a plurality of fins that extends from the base 320. The operation body 200 is then pressed downward, so that the locking slot 240 receives the other ear 520 of the socket 50 therein. The pressing portion 120 thus deforms and exerts force on the heat sink 300, thereby retaining the heat sink 300 against the electronic package 400. However, in assembly of the operation body 200 to the corresponding ear 520, a user needs to press the operation body 200 downward with one hand, and pull the operation body 200 inwardly with the other hand at the same time, so that the locking slot 240 receives said other ear 520. A corresponding two-handed operation is required in disassembly of the operation body 200 from the corresponding ear 520. The operation body 200 is generally small. It can be difficult for the user to operate the small operation body 200 with both hands, especially in a narrow space inside an electronic enclosure. Therefore, even though the strip clip has improved retaining capability in comparison with the wire clip described above, the strip clip still has relatively poor operability.

An improved heat sink mounting apparatus which can provide both good retaining capability and good operability is desired.

SUMMARY OF THE INVENTION

Accordingly, an object of the present invention is to provide a heat sink mounting assembly for readily installing or removing a heat sink on or from an electronic package such as a CPU.

Another object of the present invention is to provide a heat sink mounting assembly for securely mounting a heat sink on an electronic package such as a CPU.

To achieve the above-mentioned objects, a heat sink mounting assembly in accordance with a preferred embodiment of the present invention comprises a retention module mounted on a circuit board, and a pair of retaining units cooperating with the retention module for securing a heat sink on an electronic package such as a CPU. The retention module comprises four columns cooperatively defining a space therebetween accommodating the heat sink therein. Each of the retaining units comprises a retaining clip having first and second legs releasably engaging with two corresponding columns, and a pressing body attached to the retaining clip. The pressing body comprises a pressing portion disposed between the retaining clip and the heat sink. An operation tab extends outwardly from a distal end of the pressing body. A pair of parallel releasing arms depends from the pressing body. A spring finger extends from each releasing arm. When the operation portion is pressed toward the heat sink, the pressing portion of the pressing body urges against the heat sink to secure the heat sink in the space of the retention module, and the spring fingers engage with the retaining clip to retain the pressing body in a locked position. When the releasing arms are squeezed, the spring fingers disengage from the retaining clip to release the pressing body from the locked position, and the pressing portion is released from the heat sink.

Other objects, advantages and novel features of the present invention will be drawn from the following detailed description of the preferred embodiment of the present invention with attached drawings, in which:

DESCRIPTION OF THE PREFERRED EMBODIMENT

Figure 1:
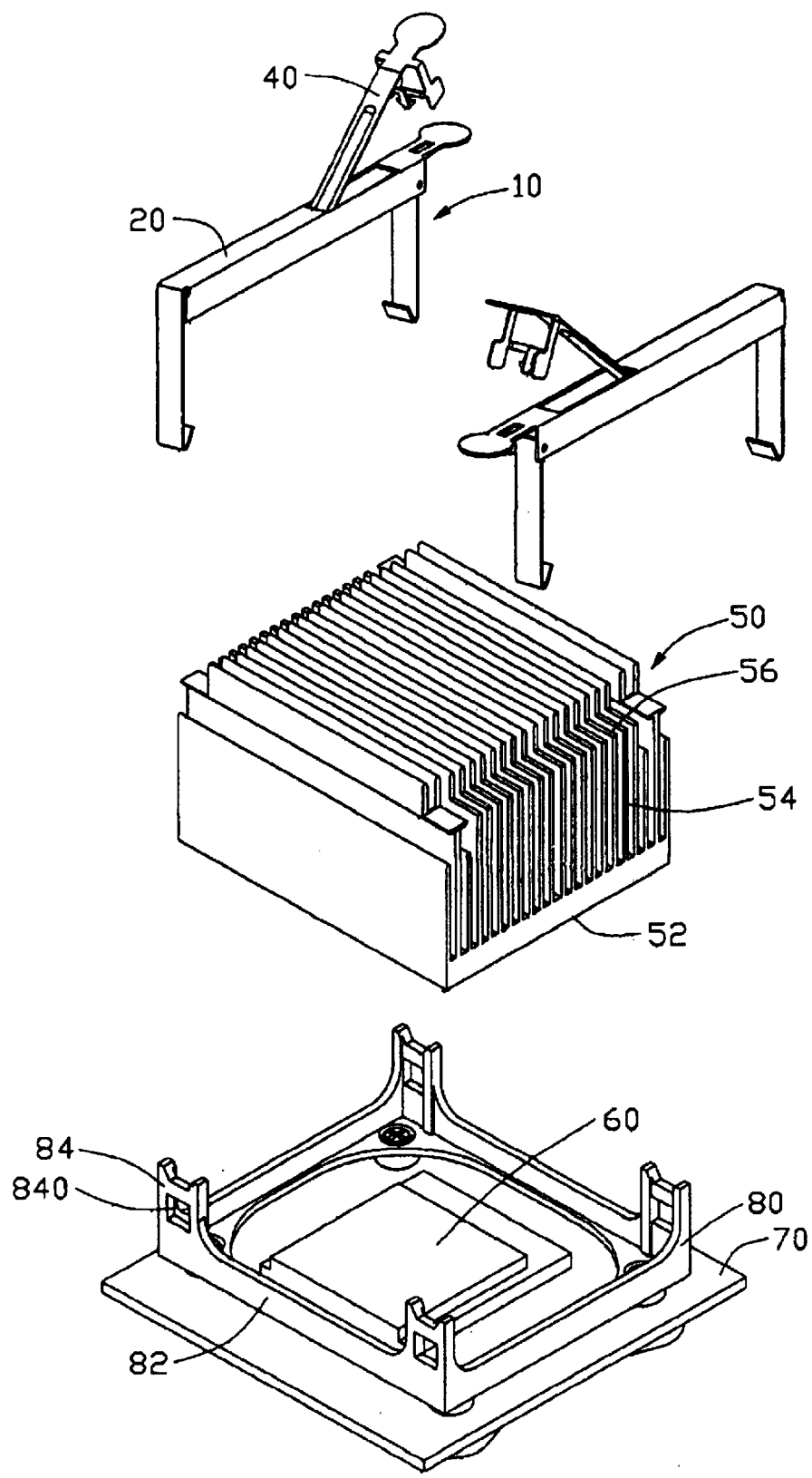
FIG. 1 is an exploded, isometric view of a heat sink mounting assembly in accordance with the preferred embodiment of the present invention, together with a heat sink, and a CPU located on a printed circuit board, the heat sink mounting assembly comprising a retention module attached on the printed circuit board, and a pair of retaining units for cooperating with the retention module.

FIG. 1 illustrates a heat sink mounting assembly in accordance with the preferred embodiment of the present invention, together with a printed circuit board 70 (PCB), an electronic package such as a CPU 60 attached on the PCB 70, and a heat sink 50 for attaching on the CPU 60. The heat sink 50 comprises a base 52 for thermally contacting a top surface of the CPU 60, and a plurality of cooling fins 54 extending upwardly from the base 52. Each fin 54 defines a pair of cutouts (not labeled) in opposite top corners thereof respectively. The fins 54 thus cooperatively define a pair of shoulders 56 at opposite sides of the heat sink 50 respectively.

The heat sink mounting assembly according to the preferred embodiment comprises a retention module 80 attached to the PCB 70, and a pair of retaining units 10 cooperating with the retention module 80 to attach the heat sink 50 on the CPU 60.

The retention module 80 comprises a base frame 82 surrounding the CPU 60, and four columns 84 extending upwardly from four corners of the base frame 82 respectively. The frame 82 and columns 84 cooperatively define a generally rectangular space (not labeled) therebetween, for accommodating the heat sink 50 therein. A locking hole 840 is defined in each column 84.

Figure 2:
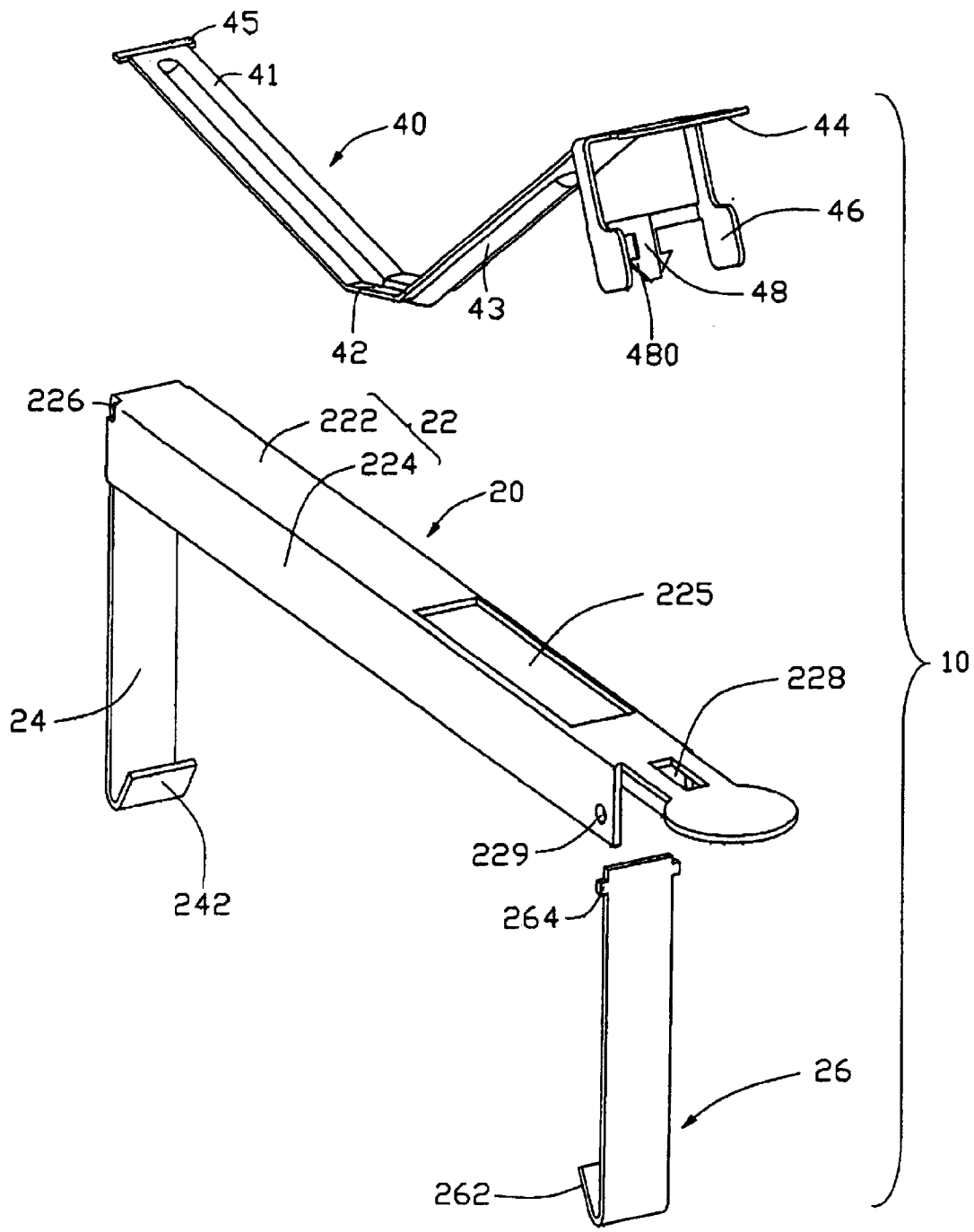
FIG. 2 is an exploded, enlarged, isometric view of one of the retaining units of the heat sink mounting assembly of FIG. 1, but viewed from a different aspect.

Referring also to FIG. 2, each retaining unit 10 comprises a retaining clip 20, and a pressing body 40 attached to the retaining clip 20. The retaining clip 20 comprises an elongated main body 22, a first leg 24 extending downwardly from a first end of the main body 22, and a second leg 26 attached to an opposite second end of the main body 22. The main body 22 comprises a horizontal top wall 222, and a pair of vertical sidewalls 224 extending downwardly from opposite long sides of the top wall 222. The top wall 222 and the sidewalls 224 cooperatively define a channel (not labeled) therebetween. The first leg 24 extends downwardly from a first end of the top wall 222. A distal end of the first leg 24 is bent inwardly and upwardly to form a first hook 242. A notch 226 is defined in a first end of each sidewall 224. Each notch 226 is bounded by the first end of the top wall 222 and a top portion of the first leg 24. A pair of mounting holes 229 is defined in second ends of the sidewalls 224 that are opposite from the first ends thereof, respectively. The mounting holes 229 are opposite each other across the channel. A pair of first protrusions 264 is outwardly formed from opposite edges of a top portion of the second leg 26 respectively. The first protrusions 264 are extended into the mounting holes 229, thereby pivotably mounting the second leg 26 to the sidewalls 224. A distal end of the second leg 26 is bent inwardly and upwardly to form a second hook 262. A longitudinal slot 225 is defined in the top wall 222, near a second end of the top wall 222 that is opposite from the first end thereof. A latch opening 228 is defined in the second end of the top wall 222.

The pressing body 40 is generally V-shaped, and comprises a central pressing portion 42, and first and second portions 41, 43 extending slantingly upwardly from opposite ends of the pressing portion 42 respectively. A pair of second protrusions 45 extends outwardly in opposite directions from a distal end of the first portion 41. The second protrusions 45 correspond to the notches 226 of the main body 22 of the retaining clip 20. An operation tab 44 extends slantingly from a distal end the second portion 43. A pair of parallel releasing arms 46 extends downwardly from opposite sides of the operation tab 44 respectively. Each releasing arm 46 inwardly forms an L-shaped spring finger 48. The spring fingers 48 partly overlap each other between the releasing arms 46. A bottom free end of each spring finger 48 forms a barb 480, with the barbs 480 of the spring fingers 48 being generally symmetrically opposite to each other. A combined distance spanned by the barbs 480 is greater than a corresponding width of the latch opening 228 of the main body 22 of the retaining clip 20.

In assembly of each retaining unit 10, the first portion 41 is inserted into the channel of the main body 22 of the retaining clip 20 via the slot 225. The second protrusions 45 of the first portion 41 are engaged into the notches 226 of the main body 22. The first protrusions 264 of the second leg 26 are then pivotably received in the mounting holes 229 of the main body 22. The retaining units 10 are thus assembled.

Figure 3:
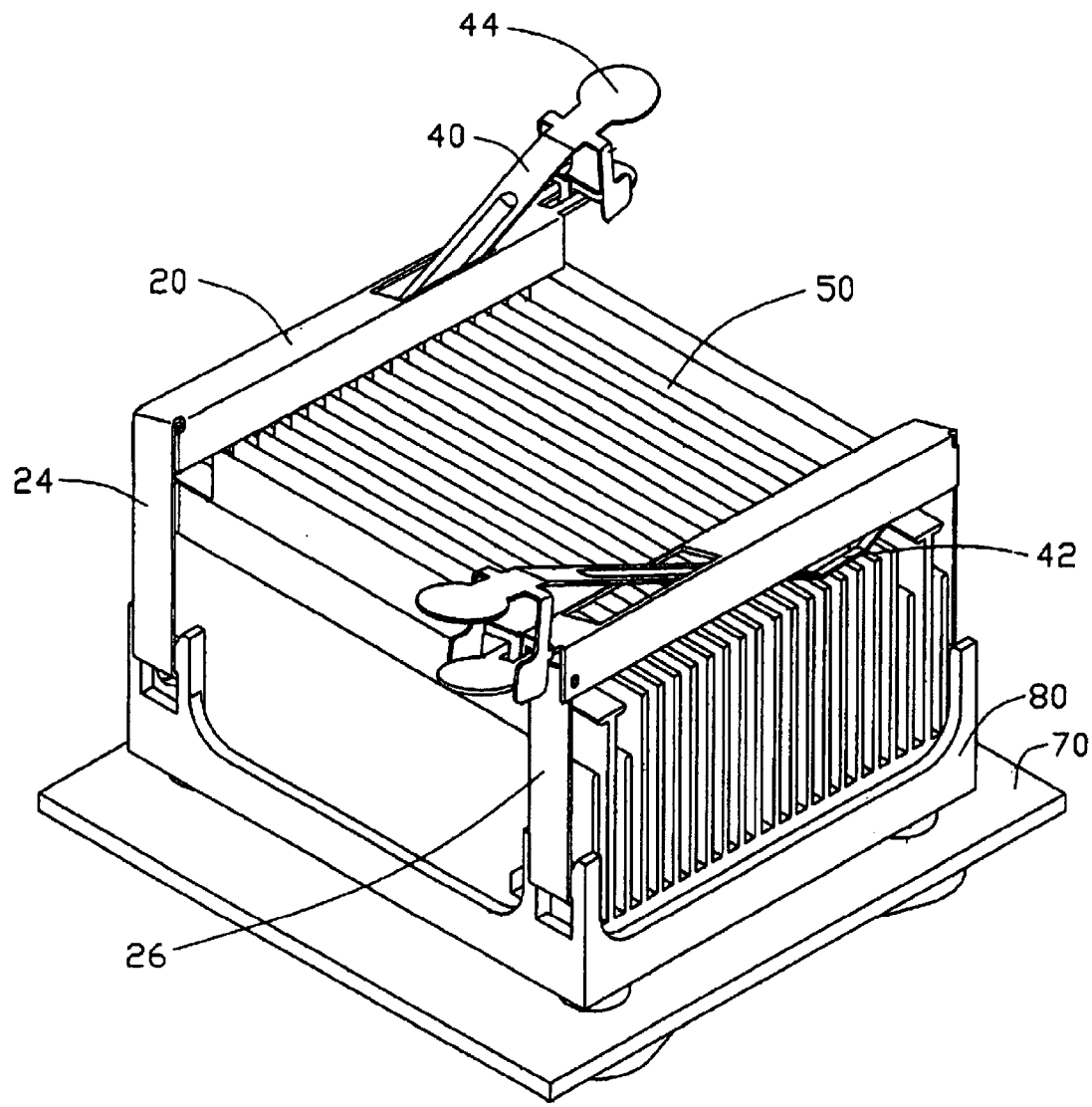
FIG. 3 is an assembled view of FIG. 1, showing the retaining units in respective locked positions.
Figure 4:
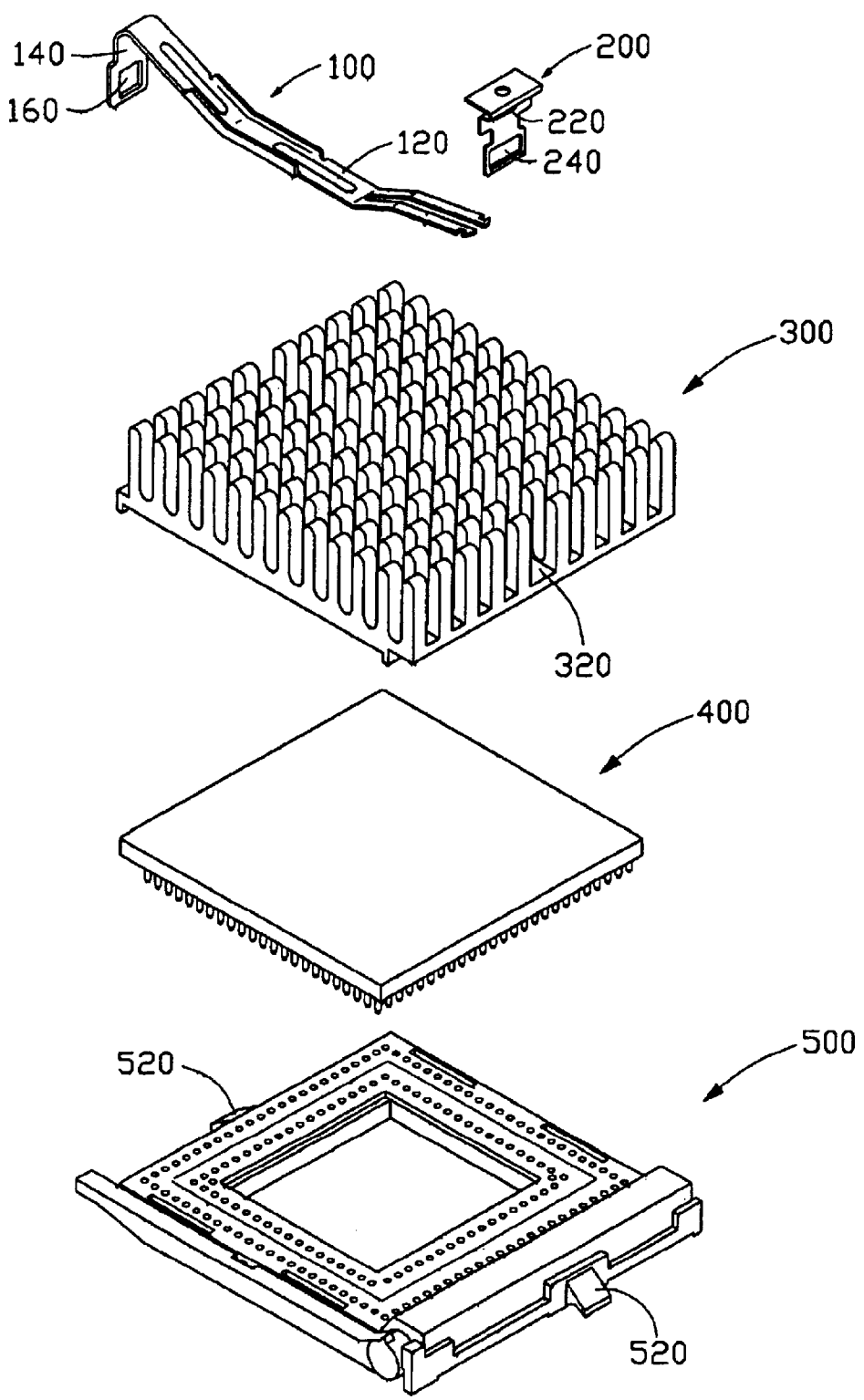
FIG. 4 is a schematic, exploded, isometric view of a conventional heat sink assembly.

Referring also to FIG. 3, in assembly of the heat sink mounting assembly, the heat sink 50 is placed in said space of the retention module 80. The base 52 of the heat sink 50 is in loose contact with the top surface of the CPU 60.

The retaining units 10 are then placed on the shoulders 56 of the heat sink 50 respectively. The first and second hooks 242, 262 of the first and second legs 24, 26 of each retaining unit 10 are loosely engaged in corresponding locking holes 840 of the columns 84 of the retention module 80. The operation tab 44 of the pressing body 40 is pressed down toward the retaining clip 20, thereby deforming the pressing body 40 toward the heat sink 50. When the barbs 480 of the spring fingers 48 reach the latch opening 228 of the main body 22, the spring fingers 48 elastically deform slightly as tapered edges of the barbs 48 ride over edges of the main body 22 at the latch opening 228. Once the tapered edges of the barbs 480 have completely ridden over said edges of the main body 22, the releasing arms 46 elastically rebound, and the spring fingers 48 return to their original states. That is, the barbs 480 are snappingly engaged under the main body 22 at the latch opening 228. Simultaneously, the pressing portion 42 of the pressing body 40 resiliently urges the corresponding shoulder 56 of the heat sink 50, and the first and second hooks 242, 262 are resiliently engaged in the locking holes 840 of the retention module 80. The heat sink 50 is thus firmly secured on the CPU 60 in said space of the retention module 80 by the retaining units 10.

To remove the heat sink 50, the releasing arms 46 of the pressing body 40 of each retaining unit 10 are squeezed together, the second portion 43 rebounds to its original orientation, and the barbs 480 of the spring fingers 48 move up and out from the latch opening 228 of the main body 22. The first and second hooks 242, 262 are disengaged from the locking holes 840 of the retention module 80. The retaining units 10 are removed from the heat sink 50. The heat sink 50 is then readily removed from said space of the retention module 80.

In the heat sink mounting assembly of the present invention, each retaining unit 10 is engaged with the heat sink 50 and the retention module 80 merely by pressing the operation tab 44 of the pressing body 40. Further, each retaining unit 10 is detached from the heat sink 50 and the retention module 80 merely by squeezing the releasing arms 46 of the pressing body 40. No tools or other actuation means are required. The heat sink mounting assembly provides easy and convenient operation.

It is noted that in the preferred embodiment of the present invention, the second leg 26 is a separate component prior to attachment to the main body 22. In an alternative embodiment, the second leg 26 integrally extends from the second end of the main body 22.

Furthermore, in the preferred embodiment of the present invention, the retention module 80 comprises four columns 84 each defining a locking hole 840 therein. The first and second legs 24, 26 of each retaining unit 10 respectively have first and second hooks 242, 262 engaging in corresponding locking holes 840. In a further alternative embodiment, each retaining unit 10 may instead cooperate with other retention means such as a CPU socket on which the CPU 60 is mounted. In such case, the CPU socket defines a pair of locking holes in each of opposite sides thereof, the locking holes receiving respective first and second hooks 242, 262 of the retaining clips 10 therein.

It is understood that the invention may be embodied in other forms without departing from the spirit thereof. The above-described examples and embodiments are to be considered in all respects as illustrative and not restrictive, and the invention is not to be limited to the details given above.

What is claimed is:

1. A mounting assembly adapted for mounting a heat sink on an electronic package on a circuit board, the mounting assembly comprising:
   a retention module adapted to be mounted on the circuit board, the retention module comprising a pair of columns cooperatively defining a space therebetween adapted for accommodating the heat sink therein; and
   a retaining unit cooperating with the columns for securing the heat sink in said space, each of the retaining units comprising:
      a retaining clip comprising first and second legs releasably engaging with the columns respectively; and
      a pressing body attached to the retaining clip, the pressing body comprising a pressing portion disposed between the retaining clip and the heat sink, an operation portion disposed outside the retaining clip opposite to the pressing portion, and latching devices formed adjacent the operation portion; wherein
   upon pressing the operation portion toward the heat sink, the latching devices engage with the retaining clip to retain the pressing body in a locked position and to elastically deform the pressing body to thereby press the heat sink toward the electronic package.

2. The mounting assembly as described in claim 1, wherein the retaining clip further comprises an elongated main body, and the first and second legs are located at opposite first and second ends of the main body respectively.

3. The mounting assembly as described in claim 2, wherein each of the first and second legs forms a hook at a distal end thereof, each of the columns defines a locking hole therein, and the locking holes receive the hooks therein.

4. The mounting assembly as described in claim 2, wherein the main body of the retaining clip comprises a top wall, and two sidewalls extending downwardly from opposite sides of the top wall, the top wall and sidewalls cooperatively defining a channel therebetween, the pressing body being partly received in said channel.

5. The mounting assembly as described in claim 2, wherein the pressing body comprises a pair of protrusions formed at a first end thereof, and the main body defines a pair of notches in the first end thereof, the notches receiving the protrusions therein.

6. The mounting assembly as described in claim 4, wherein the top wall defines a slot therein, and the pressing body extends into said channel via the slot.

7. The mounting assembly as described in claim 4, wherein the top wall defines a latch opening therein, the latch devices of the pressing body comprise at least one spring finger, said spring finger forms a barb at a distal end thereof, and the barb snappingly engages with the main body at the latch opening to retain the pressing body in said locked position.

8. The mounting assembly as described in claim 7, wherein the latch devices further comprise a pair of releasing arms extending downwardly from opposite sides of the pressing body, and two spring fingers extending from the releasing arms respectively.

9. The mounting assembly as described in claim 8, wherein the spring fingers are disengaged from the main body at the latch opening upon squeezing the releasing arms.

10. A heat sink assembly comprising:
    a heat sink adapted to contact an electronic device for removing heat generated by the electronic device;
    a retention device adapted to be mounted on a circuit board; and
    a retaining unit cooperating with the retention device to sandwich the heat sink therebetween, the retaining unit comprising:
       a retaining clip comprising a main body located above the heat sink, and first and second legs releasably engaging with opposite sides of the retention device; and
       a pressing body comprising a pressing portion located between the retaining clip and the heat sink, for pressing the heat sink toward the electronic device when the pressing body is disposed in a locked position, and latch means for engaging with the retaining clip to maintain the pressing body in said locked position; wherein
    the pressing body further comprises a releasing device, and upon operating the releasing device to move to an unlocked position, the pressing body is released from said locked position.

11. The heat sink assembly as described in claim 10, wherein complementary interlocking devices are formed on the first and second legs and on opposite sides of the retention device.

12. The heat sink assembly as described in claim 10, wherein the pressing body further comprises an operation portion, and the latch means snappingly engages with the retaining clip upon pressing the operation portion toward the retaining clip.

13. The heat sink assembly as described in claim 10, wherein the main body of the retaining clip comprises a top wall, and two sidewalls extending from opposite sides of the top wall, the top wall and sidewalls cooperatively defining a channel therebetween, and part of the pressing body is received in said channel.

14. The heat sink assembly as described in claim 13, wherein the top wall of the retaining clip defines a slot therein, and the pressing body extends into said channel via the slot.

15. The heat sink assembly as described in claim 10, wherein the retaining clip defines a latch opening therein, the latch means of the pressing body comprises a pair of spring fingers, each of the spring fingers forms a barb at a distal end thereof, and the barbs are engaged in the latch opening.

16. The heat sink assembly as described in claim 15, wherein the releasing device comprises a pair of releasing arms extending from the pressing body, and the spring fingers extend inwardly from respective releasing arms.

17. A heat sink assembly comprising:
    a printed circuit board;
    a retention device mounted on the printed circuit board;
    a heat generating device located above the printed circuit board;
    a heat sink mounted upon the heat generating device;
    at least one retaining unit positioned upon the heat sink, said retaining unit including:
    a retaining clip moveable relative to the heat sink and defining a main body with two opposite legs to be respectively engaged with the retention device; and
    a pressing body attached to the retaining clip in a moveable manner; said pressing body defining a central pressing portion sandwiched between the retaining clip and the heat sink, and at least one upwardly extending resilient portion with a locking finger thereof; wherein
    when said locking finger is locked to the retaining clip, the upwardly extending resilient portion is deflected and results in a reflection force upon the retaining clip to urge the retaining clip to move upwardly whereby the whole retaining unit is in a tension manner for tightly pressing downwardly the heat ink against the heat generating device; oppositely when said locking finger is unlocked from the retaining clip, the upwardly extending resilient portion is relatively undeflected and exposed to an exterior above said retaining clip whereby the whole retaining unit is in a relaxed manner.

* * * * *